(12) United States Patent
Andreev et al.

(10) Patent No.: US 8,587,897 B2
(45) Date of Patent: Nov. 19, 2013

(54) MAGNETIC FIELD SENSOR

(75) Inventors: Aleksey Andreev, Cambridge (GB);
David Williams, Cambridge (GB);
Ernesto E. Marinero, Saratoga, CA (US); Bruce A. Gurney, San Jose, CA (US); Thomas D. Boone, Jr., San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 636 days.

(21) Appl. No.: 12/565,555

(22) Filed: Sep. 23, 2009

(65) Prior Publication Data

US 2010/0073796 A1  Mar. 25, 2010

(30) Foreign Application Priority Data

Sep. 23, 2008 (EP) .................................. 08164950

(51) Int. Cl.
*G11B 5/37* (2006.01)
(52) U.S. Cl.
USPC ........................................................ 360/112
(58) Field of Classification Search
USPC ........ 360/112, 313; 850/46, 48; 235/449, 493
See application file for complete search history.

(56) References Cited

U.S. PATENT DOCUMENTS

| | | | | |
|---|---|---|---|---|
| 5,208,477 A | * | 5/1993 | Kub ............................... | 257/421 |
| 7,440,227 B2 | * | 10/2008 | Chattopadhyay et al. .... | 360/112 |
| 2002/0117656 A1 | | 8/2002 | Amin et al. ....................... | 257/9 |

FOREIGN PATENT DOCUMENTS

| | | |
|---|---|---|
| AU | 2008/201551 | 5/2008 |
| WO | 97/47982 | 12/1997 |
| WO | 02/19436 | 3/2002 |
| WO | 2008/033303 | 3/2008 |

OTHER PUBLICATIONS

Chapter 12 of "Magnetic Information Storage Technology" *ibid*.
Brataas A. et al: "Non-collinear magnetoelectronics" Physics Reports, North-Holland, vol. 427, No. 4, Apr. 1, 2006, p. 157-255.
Goodnick et al:"Quantum-effect and single-electron devices" IEEE Transactions on Nanotechnology, IEEE Service Center, Piscataway, NJ, US, vol. 2, No. 4, Dec. 1, 2003, p. 368-385.
Martn J I et al:"Ordered magnetic nanostructures: fabrication and properties" Journal of Magnetism and Magnetic Materials, Elsevier Science Publishers, Amsterdam, NL, vol. 256, No. 1-3, Jan. 1, 2003, p. 449-501.
Merkt U: "Hybrid semiconductor/metal nanostructures with two-dimensional electron systems" Superlattices and Microstructures, Academic Press, London, GB, vol. 33. No. 5-6, May 1, 2003, p. 357-367.

(Continued)

*Primary Examiner* — Julie Anne Watko
(74) *Attorney, Agent, or Firm* — Zilka-Kotab, PC

(57) ABSTRACT

A device for sensing a magnetic field is described. The device comprises first, second and third leads and a junction between the leads. The junction and leads are arranged in a plane and the junction is configured to exhibit quantum confinement in a direction perpendicular to the plane. The first lead is arranged on one side of the junction and the second and third leads are arranged on an opposite side of the junction. The first lead is configured to limit angle of spread of charge carriers entering the junction so that, when charge carriers flow into the junction from the first lead, the charge carriers form a substantially nondivergent beam.

7 Claims, 9 Drawing Sheets

(56) References Cited

OTHER PUBLICATIONS

Borghs G et al: "Material aspects of spin injection in semiconductors" Materials Science and Engineering B, Elsevier Sequoia, Lausanne, Ch, vol. 84, No. 1-2, Jul. 5, 2001, p. 75-80.

G.M. Jones et al., "Quantum steering of electron wave function in an InAs Y-branch switch" Applied Physics Letters, vol. 86, p. 073117 (2005).

G. Reiss et al., "Magnetoresistive sensors and magnetic nanoparticles for biotechnology" Journal of Material Research, vol. 20, p. 3294 (2005).

J. Spector et al., "Electron focusing in two-dimensional systems by means of an electrostatic lens" Applied Physics Letters, vol. 56. p. 1290 (1990).

J. Spector et al., "Refractive switch for two-dimensional electrons" Applied Physics Letters, vol. 56, p. 2433 (1990).

Shan X. Wang and Alexander M. Taratorin, Chapter 8 and Chapter 12, of "Magnetic Information Storage Technology" Academic Press, p. 207-231 (1990).

Shankar K S et al: "Fabrication of nanowires of multicomponent oxides: Review of recent advances" Materials Science and Engineering C, Elsevier Science S.A., Ch, vol. 25, No. 5-8, Dec. 1, 2005, p. 738-751.

Dan Csontos Andhqxu: "Scattering-matrix formalism of electron transport through three-terminal quantum structures: formulation and application to y-junction devices" Journal of Physics: Condensed Matter, Institute of Physics Publishing, Bristol, GB, vol. 14, Nov. 15, 2002, p. 12513-12528.

Csontos Dan et al: "Quantum effects in the transport properties of nanoelectronic three-terminal y-junction devices" Physical review, B. Condensed Matter, American Institute of Physics, New York, US, vol. 67, Jun. 23, 2003, p. 235122/1-235322/10.

Worschech L et al: "Bias-voltage-induced asymmetry in nanoelectronic Y-branches" Applied Physics Letters, AIP, American Institute of Physics, Melville, NY, US, vol. 79, No. 20, Nov. 12, 2001, p. 3287-3289.

Muller et al: "A three-terminal planar selfgating device for nanoelectronic applications" Solid State Electronics, Elsevier Science Publishers, Barking, GB, vol. 49, No. 12, Dec. 1, 2005, p. 1990-1995.

Xu H Q: "Diode and transistor behaviors of three-terminal ballistic junctions" Applied Physics Letters, AIP, American Institute of Physics, Melville, NY, US, vol. 80, No. 5, Feb. 4, 2002, p. 853-855.

Arutyunov K Yu et al., "Superconductivity in one dimension" Physics Report, North-Holland, vol. 464, No. 1-2, Jul. 1, 2008, p. 1-70.

\* cited by examiner

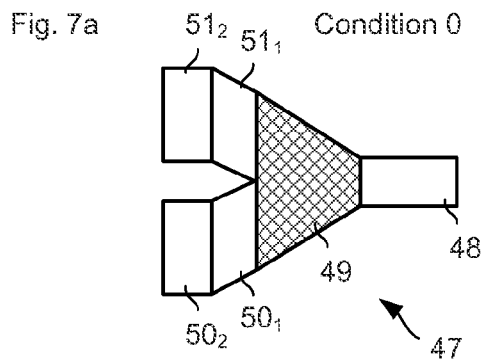
Fig. 7a  Condition 0
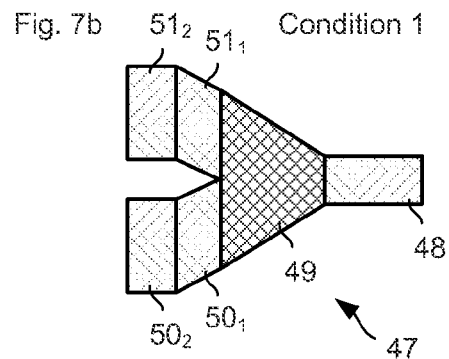
Fig. 7b  Condition 1
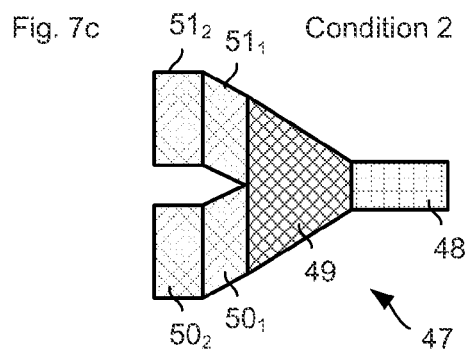
Fig. 7c  Condition 2
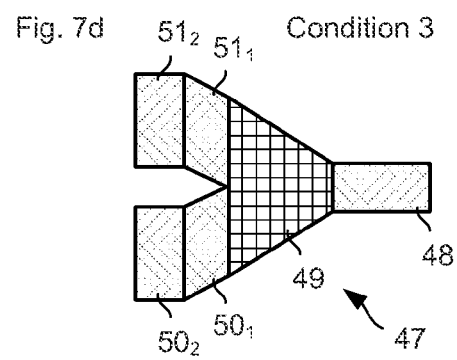
Fig. 7d  Condition 3
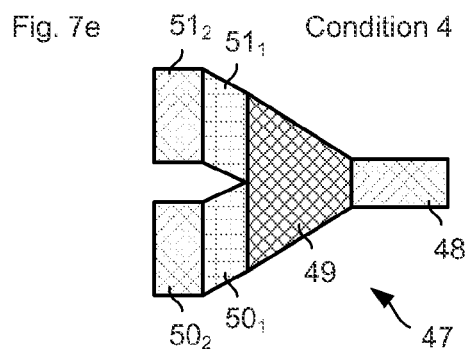
Fig. 7e  Condition 4
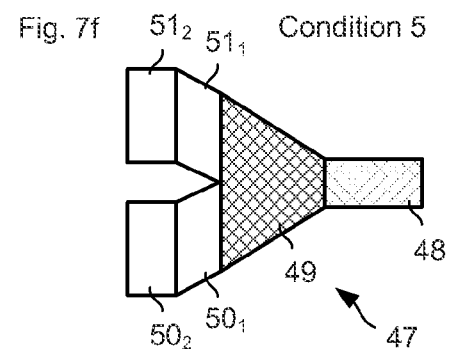
Fig. 7f  Condition 5
 B = 0mT; $V_G$ = 0V
 B = + 50mT; $V_G$ = 0 V
 B = − 50mT; $V_G$ = 0 V
 B = + 50mT; $V_G$ = 0.4V
 B = − 50mT; $V_G$ = 0.4V

MAGNETIC FIELD SENSOR

RELATED APPLICATIONS

The present application claims priority from European Patent Application Filed Sep. 23, 2008 under Application No. EP 08164950.1, which is incorporated herein by reference.

FIELD OF THE INVENTION

The present invention relates to a magnetic field sensor, particularly, but not exclusively, for use in data storage or magnetic imaging.

BACKGROUND OF THE INVENTION

Hard disk drives (HDDs) are widely used for high-density information storage. HDDs are commonly found in computer systems traditionally associated with this type of storage, such as servers and desktop computers. However, HDDs having smaller form factors, such as one-inch drives, can also be found in hand-held electronic devices, such as music players and digital cameras.

Higher storage capacity in HDDs can be achieved by increasing storage density. This involves reducing the size of bit cells in recording media. By reducing the size of the bit cell to less than about 20 nm×20 nm, storage densities greater than one terabits per inch ($1 Tb/in^2$) can be achieved.

However, existing read elements in read/write heads for a hard disk drive which are based on the giant magnetoresistance (GMR) effect are expected to encounter problems as they are scaled down to these sizes due to for example, spin torque and thermally-induced magnetic noise.

Alternative read elements have been suggested and much attention is being focused on devices based on the extraordinary magnetoresistance (EMR) effect.

"Quantum steering of electron wave function in an InAs Y-branch switch" by G. M. Jones et al., Applied Physics Letters, volume 86, page 073117 (2005) describes a Y-channel transistor. However, Y-channel transistors have only been considered for use as fast digital switches, for example, in information processing.

SUMMARY OF THE INVENTION

According to a first aspect of certain embodiments of the present invention there is provided a device for sensing a magnetic field comprising first, second and third leads and a junction between the leads, wherein the junction and leads are arranged in a plane and the junction is configured to exhibit quantum confinement in a direction perpendicular to the plane, wherein the first lead is arranged on one side of the junction and the second and third leads are arranged on an opposite side of the junction and wherein the first lead is configured to limit angular distribution of charge carriers entering the junction so that, when charge carriers flow into the junction from the first lead, the charge carriers emerge from the first lead as a substantially nondivergent beam.

Thus, the device may be used as a magnetic field sensor, for example, in data storage or magnetic imaging applications. The junction serves as the magnetic field sensing region and can be scaled down to dimensions of just a few nanometres. Moreover, the apparatus can be used to sense magnetic fields at low field strengths, e.g. about 50 mT, and at high temperature, e.g. above room temperature.

The first lead may be elongated along a longitudinal axis and, when charge carriers flow from the first lead into the junction, the charge carriers' flow are substantially parallel to the longitudinal axis. The first lead may be configured to exhibit quantum confinement in a lateral direction so as to provide a quantum wire. The device may further comprise a gate structure configured to provide an electrostatic lens for focussing charge carriers in the first lead so as to limit the angle of spread of charge carriers entering the junction. A portion of the first lead which is configured to limit angle of spread of charge carriers entering the junction may be adjacent to the junction.

The junction and, optionally, at least one of the leads may comprise a non-ferromagnetic and/or semiconducting material.

The junction may have an area equal to or less than about $1000 nm^2$ or equal to or less than about $400 nm^2$. Thus, the device may be used to sense magnetic fields, for example, in high storage density hard disk drives or in magnetic imaging of nanoscale reactions or processes in chemical, biological or medical applications.

The device may comprise a layer of material providing the leads and junction.

The first lead and the junction may be arranged in a line, wherein the junction is forward of the first lead, and the second and third regions are configured to branch forwardly from the junction on each side of the line. This arrangement can help to increase the magnitude of the response of the device to the application of a magnetic field.

The junction may increase in width from the first lead to the second and third leads. This can help to form a smooth channel and so reduce reflection from the junction.

The device may comprise at least four leads connected to the junction, the at least four leads including the first lead and the second and third leads. Additional leads can be used as additional drains, for providing charge carrier steering and/or for gating.

The device may further comprise a gate structure for applying an electric field to the junction. The gate structure may include gates arranged either side of the junction. The gate structure can be used to increase sensitivity of the device and/or to tune its operation.

The junction and, optionally, at least one of the leads comprises a region of material may has a relatively small bandgap sandwiched between underlying and overlying regions of material(s) having relatively large bandgap(s). The junction and, optionally, at least one of the leads may comprise a reduced-dimensional electron or hole gas. The junction and, optionally, at least one of the leads may comprise an alloy of group III and group V elements. This can help to achieve a high mobility. The junction and, optionally, at least one of the leads may comprise a group IV element, such as silicon. This can help to simplify fabrication of the device. The junction may be under strain or stress. This can help to increase mobility.

According to a second aspect of certain embodiments of the present invention there is provided apparatus comprising the device and a circuit configured to cause current to flow from the first lead into the second and third leads and to compare magnitudes of current flowing into the second and third leads.

Additionally or alternatively, the circuit may be configured to measure the sum of the current flowing into the second and third leads for a given bias applied to the first lead.

The apparatus may be part of a hard disk drive. According to a third aspect of certain embodiments of the present invention there is provided a hard disk drive including the apparatus.

According to a fourth aspect of certain embodiments of the present invention there is provided an apparatus for magnetic imaging comprising an array of the devices and a circuit configured to receive respective signals from each device and to form an image.

According to a fifth aspect of certain embodiments of the present invention there is apparatus for scanning magnetic imaging, comprising the device, a scanner for positioning the device and a circuit configured to receive signals from the device and the scanner and to process the signals so as to form an image. The scanner may be a positioning stage. The scanner may include a fine positioning stage, such as a piezoelectric scanner, for moving the device in two or three orthogonal directions by displacements of the order of 1 or 10 nm. The scanning means may include a coarse positioning stage for moving the device in two or three orthogonal directions by displacements of the order of 10 nm or greater or 100 nm or greater. The coarse positioning stage may be suitable for moving the device in two or three orthogonal directions by displacements up to the order of 1 cm or more.

According to a sixth aspect of certain embodiments of the present invention there is provided a method of operating a device for sensing a magnetic field comprising first, second and third leads, a junction between the leads, wherein the junction and leads are arranged in a plane and the junction is configured to exhibit quantum confinement in a direction perpendicular to the plane, wherein the first lead is arranged on one side of the junction and the second and third leads are arranged on an opposite side of the junction and wherein the first lead is configured to limit angular distribution of charge carriers entering the junction so that, when charge carriers flow into the junction from the first lead, the charge carriers emerge from the first lead as a substantially nondivergent beam, the method comprising applying a bias between the first lead and the second and third leads and comparing currents flowing into the second and third leads.

The method may further comprise bringing a magnetic field source to within a distance less than about 100 nm from the junction.

According to a seventh aspect of certain embodiments of the present invention there is provided a use of a sensor in a data storage or imaging application, the sensor comprising first, second and third leads, a junction between the leads, wherein the junction and leads are arranged in a plane and the junction is configured to exhibit quantum confinement in a direction perpendicular to the plane and wherein the first lead is arranged on one side of the junction and the second and third leads are arranged on an opposite side of the junction.

These and other features and advantages of the invention will be apparent upon reading the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description, read in conjunction with the accompanying drawings which are not to scale.

FIGS. 7a to 7f illustrate a model of the sensor shown in FIG. 1 under several, different conditions;

DETAILED DESCRIPTION OF CERTAIN EMBODIMENTS

The following description is of the best embodiments presently contemplated for carrying out this invention. This description is made for the purpose of illustrating the general principles of this invention and is not meant to limit the inventive concepts claimed herein.

Figure 1A:
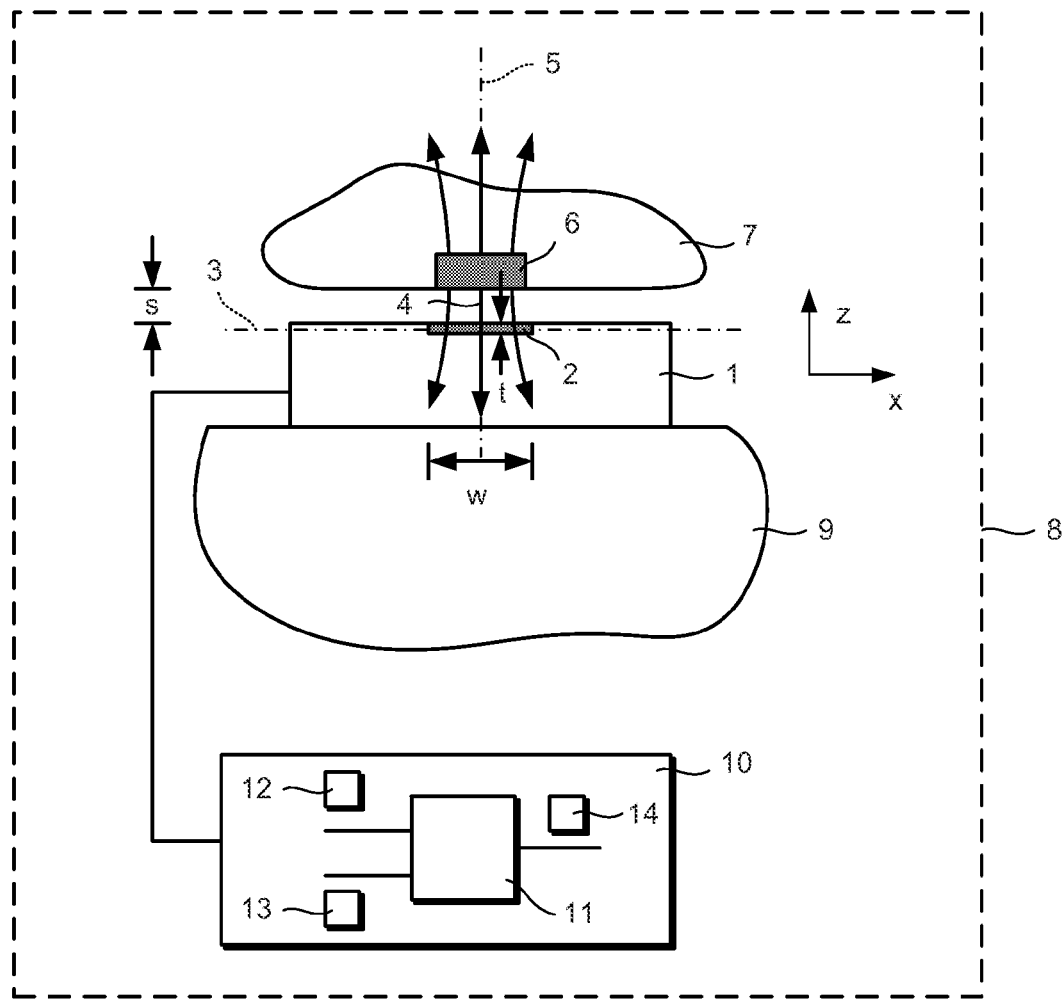
FIG. 1a is a schematic diagram of an apparatus including a magnetic field sensor and a measurement circuit.
Figure 1B:
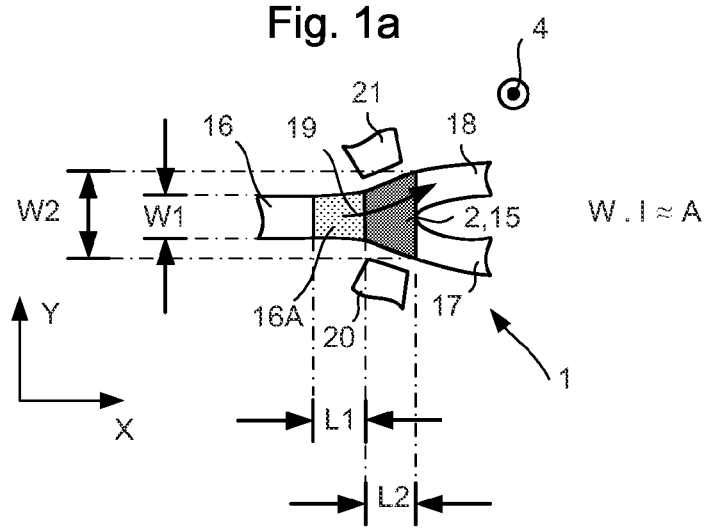
FIG. 1b is a plan view of the sensor shown in FIG. 1.

Referring to FIGS. 1a and 1b, a device 1 (herein after referred to as a "sensor") in certain embodiments of the present invention includes a thin magnetic field sensing region 2 lying in plane 3 (e.g. in an x-y plane, as shown) for sensing a magnetic field 4 passing in a direction 5 (e.g. along the z-axis, as shown) which is substantially perpendicular to the plane 3 or the sensing region 2. The magnetic field 4 is generated by a nanometer-sized magnetic field source 6, for example in the form of a magnetic nanoparticle or grain, a collection of such grains, a pillar or an isolated region of magnetic material disposed in or on, supported by and/or attached to a support 7.

The magnetic field sensing region 2 has a thickness, t, of between about 0.1 and 20 nm. For example, the magnetic field sensing region 2 may have a thickness of one or a few atomic monolayers. The sensor 1 can measure a magnetic field 4 having a field strength of the order of 1 mT or 10 mT, e.g. about 50 mT, generated by the magnetic odd source 6 which has a smallest areal dimension (e.g. width, w, or length L) of the order of 1 or 10 nm and/or an areal size, A, of the order of 10 $nm^2$, 100 $nm^2$ or 1000 $nm^2$, e.g. equal to or less than about 400 $nm^2$ or between about 400 $nm^2$ to 1000 $nm^2$, when the sensing region 2 and the field source 6 are separated by a distance, s, of the order of 1 or 10 nm.

In some embodiments, the magnetic field source 6 may be one or more magnetic grains in a data track defining a data storage bit cell, and the support 7 may be a platter (or "media") of a hard disk drive. Thus, the field source 6 may provide a magnetic bit in continuous track media, discrete track media or patterned magnetic media. In some other embodiments, the magnetic field source 6 may be a ferromagnetic nanoparticle embedded in a polymer matrix (not shown) to form a so-called "bead" which is linked to the support 7 which is in the form of DNA or protein. A superparamagnetic nanoparticle may be used.

The sensor 1 forms part of a larger device 8, such as a hard disk drive or biochip, which serves a function (or is used in an application), such as data storage or magnetic imaging. For example, an array of sensors 1 may replace the array of GMR sensors described in "Magnetoresistive sensors and magnetic nanoparticles for biotechnology" by G. Reiss et al., Journal of Material Research, volume 20, pages 3294 to 3302 (2005). Optionally, the magnetic field source 6 and support 7 may also form a permanent or semi-permanent part of the larger device 8, such as in a hard disk drive.

The sensor 1 is mounted on a support 9, e.g. incorporated into a read/write head of a hard disk drive, which may be configured to allow the sensor 1 to be positioned close (e.g. to within about 10 nm) to the magnetic field source 6 or vice versa.

The sensor 1 may be used as a scanning probe and the support 9 can be a positioning stage. The positioning stage may include a fine positioning stage, such as a piezoelectric scanner, for moving the sensor in x-, y- and z-directions by displacements typically of the order of 1. The fine positioning stage may be supported on a coarse positioning stage for moving the sensor 1 by displacements of the order of 10 nm, 100 nm or greater, for example up to displacements of the order of 1 mm or 10 mm. Thus, the sensor 1 can be scanned over a sample to build up an image in an analogous way to other forms of scanning probe microscopy.

The sensor 1 is operatively connected to a control and measurement circuit 10. The circuit 10 may be arranged to sense the presence, direction and/or magnitude of a magnetic field or detect changes in magnetic field, e.g. resulting when adjacent grains in a data track of a hard disk platter pass by the sensor 1.

The measurement circuit 10 includes a detection circuit 11 for processing signals received from the sensor 1, e.g. so as to identify pre-defined patterns or characteristics, and supplying an output signal 14. For example, in a hard disk drive, the detection circuit 11 may take the form of a readhack signal detection and processing circuit.

Referring in particular to FIG. 1*b*, the magnetic field sensing region 2 takes the form of a conductive junction 15 between three or more conductive leads 16, 17, 18. The junction 15 and leads 16, 17, 18 are arranged in the same plane 3. The first lead 16 is arranged on one side of the junction 15 and the second and third leads 17, 18 arranged on an opposite side of the junction. In this example, the junction 15 is integrally formed with the leads 16, 17, 18 by being formed in the same thin conductive layer, preferably comprising single crystal, high-mobility semiconducting material.

Thus, the junction 15 is arranged such that application of the magnetic field 4 perpendicular to the sensing region 2 causes lateral deflection of charge carriers 19, e.g. ballistic electrons, flowing through the junction 15 from the first lead 16 into the second and third leads 17, 18. In particular, when a magnetic field 4 is applied perpendicular to the plane 3 and charge carriers 19 are flowing though the junction 15, more charge carriers are deflected into the third lead 18 than the second lead 17 or vice versa depending on the direction of the magnetic field 4. By comparing respective values of current, $I_1$, $I_2$, in the second and third leads 17, 18, the presence, direction and/or magnitude of a magnetic field 4 can be determined.

The sensitivity and/or response of the sensor 1 to the application of a magnetic field 4 having low field strength (e.g. of around 50 mT) can be improved by forming a substantially nondivergent beam of charge carriers 19, e.g., diverging (laterally) by no more than about 10 degrees from a central axis. In some embodiments, the charge carriers 19 diverge by no more than about 5 degrees. In certain embodiments, the charge carriers 19 diverge by no more than about 2 degrees from the central axis.

To help guide charge carriers 19 so that their angle of approach to the junction 15 is limited to within a predetermined range, e.g. about 10 degrees or less, the sensor 1 includes a section 16*a* in the first lead 16 which collimates charge carriers 19 flowing into the junction 15. In this example, an elongate section 16*a* which is longer than it is narrow (i.e. $l_1 > w_1$) and which is longer than the bulk mean free path, λ, in the lead 16 is used. In this example, the elongate section 16*a* is adjacent to the junction 15, in other words feeds directly into the junction 15.

The section 16*a* may have a length, $l_1$, of about 100 nm to 500 nm or more. The ratio, α, of length-to-width of the section 16*a* (i.e. $l_1/w_1$) may be at least 2, 5 or 10. In some embodiments, the ratio, α, may be equal to or more than 100 or 1000.

Other arrangements for forming a nondivergent beam of charge carriers 19 may be used. For example, a collimator may be used as described in "Electron focusing in a two-dimensional system by means of an electrostatic lens" by J. Spector et al., Applied Physics Letters, volume 56, pages 1290 to 1292 (1990) or in "Refractive switch for two-dimensional electrons" by J. Spector et al., Applied Physics letters, volume 56, pages 2433 to 2435 (1990).

The section or portion of the leads 16, 17, 18 which are adjacent to the junction 15 (i.e. the section of a lead having a length of the order of 1 µm or 10 µm which directly lead into or emerge from the junction 15) lie in the plane 3 of the junction 15. Further away from the junction 15, the leads 16, 17, 18 need not lie in the plane 3 of the junction 15.

One or more gates, for example side gates 20, 21, may be used to apply an electric field in the junction 15 for controlling charge flow, e.g. by reducing kinetic energy of the charge and thus increase interaction time and deflection, and/or for tuning (or "trimming") operation of the sensor 1.

Figure 2:
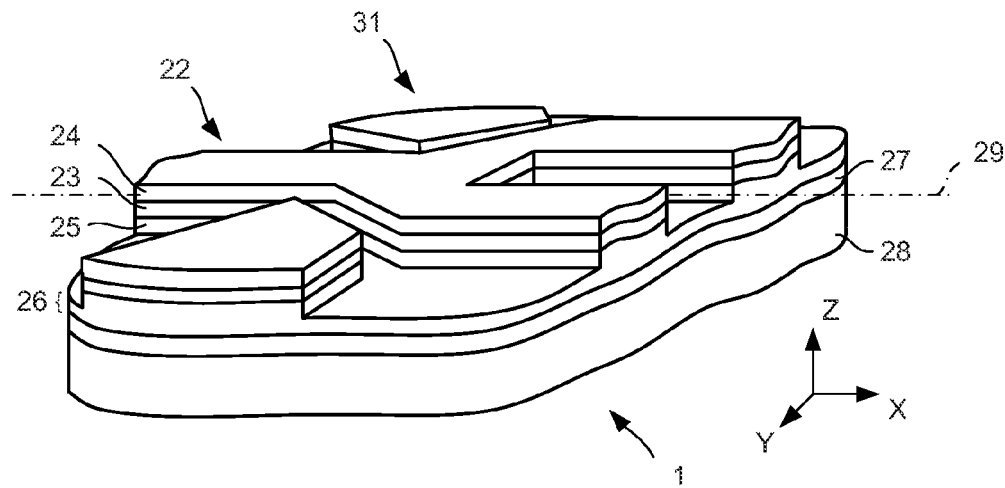
FIG. 2 is a perspective view of the sensor shown in FIG. 1.
Figure 3:
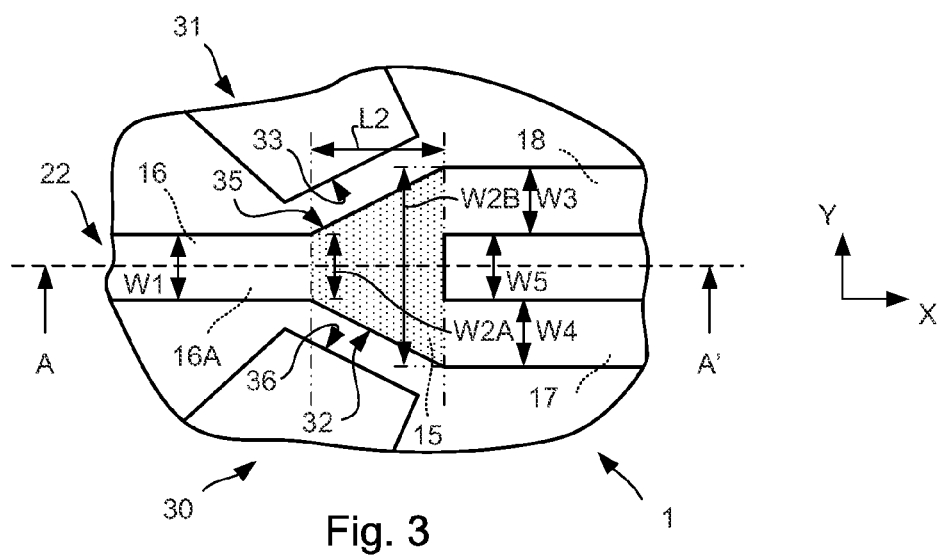
FIG. 3 is a plan view of the sensor shown in FIG. 2.
Figure 4:
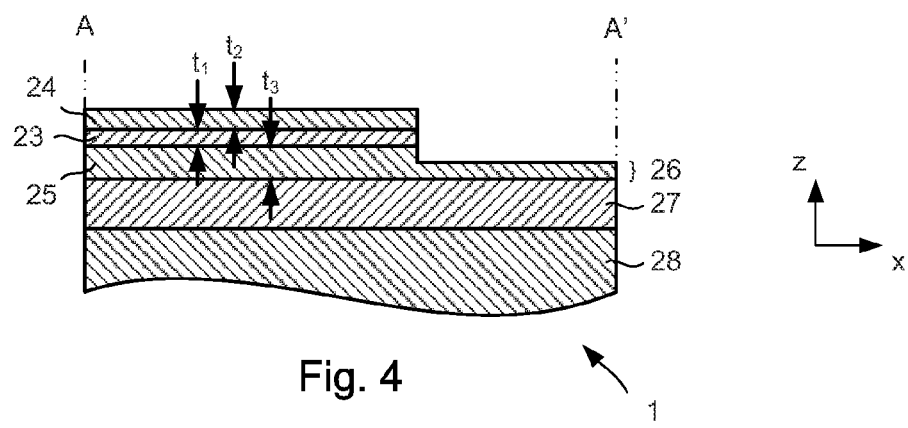
FIG. 4 is a cross sectional view of the sensor shown in FIG. 3 taken along the line A-A'.

The sensor 1 will now be described in more detail. Referring also to FIGS. 2, 3 and 4, the sensor 1 is formed by trench-isolation and includes an etched mesa structure 22 in which a thin conductive layer 23 is sandwiched between upper and lower insulating layers 24, 25. The mesa structure 22 is generally 'Y'-shaped in plan view and stands on an un-etched base portion 26 of the lower insulating layer 25. The lower insulating layer 25 is disposed on a buffer layer 27, which in turn is formed on a substrate 28.

The thin conductive layer 23 may comprise indium antimonide (InSb) having a thickness, $t_1$, of about 20 nm and the insulating layers 24, 25 may comprise indium aluminium antimonide (InAlSb) having respective thicknesses, $t_2$, $t_3$, of about 100 nm and 200 nm. Alternatively, the thin conductive layer 23 may comprise indium arsenide (InAs) having a thickness, $t_1$, typically below about 200 nm and the insulating layers 24, 25 may comprise aluminium antimonide (AlSb) and aluminium gallium antimonide (AlGaSb).

The conductive layer 23 and the insulating layers 24, 25 form a "flat-bottomed" quantum well in which the thin conductive layer 23 defines a two-dimensional conductive system. However, other forms of heterostructure can be used to form a two-dimensional electron (or hole) gas.

The conductive layer 23 is bifurcated or forked such that the first lead 16 (herein also referred to as a "source" or "source region") feeds into the junction 15 (herein also referred to as the "intermediate region" or "channel region") and second and thirds leads 17, 18 (herein also referred to as "drain" or "drain regions") emerge from the junction 15.

The conductive layer 23 is generally elongated along, a longitudinal axis 29, in this example, shown to be parallel with the x-axis. The first lead 16 and the junction 17 generally lie on the longitudinal axis 29 and the second and third leads 17, 18, having emerged from the junction 15, generally run parallel to and either side of the axis 29. As explained earlier, the first lead 1[b]6; includes a section 16a which feeds into the junction 15 which is generally long, narrow and straight. The first lead 16 may have a width, $w_1$, less than the quantum coherence length, $L_C$, and greater than the Fermi wavelength, $\lambda_f$ for bulk material forming the lead 16.

In this example, the junction 15 is generally trapezoidal in plan view. However, the junction 15 may be differently shaped and may, for example, have curved sides.

The first lead 16 is preferably thinner than the second and third leads 17, 18 which are about the same width, i.e. $w_1 < w_3 = w_4$. For example, $w_1 = (w_3/\beta)$, where $1 \leq \beta \leq 2$. This can help reduce reflection.

In this example, the width of the junction 15 increases (in a direction from the First lead 16 to the second and third leads 17, 18) from a first width, $w_{2A}$, which may be about the same as the width of the end of first lead 16 to a second width, $w_{2B}$, which may be at least the combined width of the second and third leads 17, 18, i.e. $w_{2A} = w_1$ and $w_{2B} > w_3 + w_4$.

The width, $w_1$, of the first lead 16 is of the order of 1 or 10 nm. The width, $w_1$, of the first lead 16 may be sufficiently small to form a one-dimensional quantum wire. This can have the advantage of helping to increase the operating temperature of the device by reducing phonon scattering. For example, additional confinement of a two-dimensional sheet to form a one-dimensional wire can increase spacing between quantised energy levels. Thus, if the energy of a phonon is much smaller than the spacing between the energy levels, then scattering of an electron (or hole) is less likely.

Portions of the second and third leads 16, 17 which are adjacent to the junction 15 are separated by a maximum width, $w_5$, which may be about the same as the width of the leads 17, 18, i.e. $w_5 = w_3$. Further away from the junction 15, the leads 17, 18 can diverge and/or separated by a greater width.

The length and width of the junction 15 and the configuration (e.g. angular deviation and/or curvature) of the second and third leads 17, 18 as they exit from the junction 15 can be found by routine experiment, chosen based on the expected deflection of charge carriers 19 in the junction region 15 and/or by modelling charge transport. Further away from the junction 15, the second and third leads 17, 18 may diverge and/or take an arbitrary path in any direction including out of the plane 3 in which the sensing region 2 lies.

Trench-isolation also leaves side mesa structures 30, 31 in which conductive layer portions provide side gates 20, 21 which are laterally spaced from and in plane with the patterned conductive layer 23.

Referring in particular to FIG. 3, proximate edges 36, 33 of the side mesa structures 30, 31 generally follow corresponding side edges 32, 35 of the mesa structure 22 in the vicinity of the junction 23.

Figure 5:
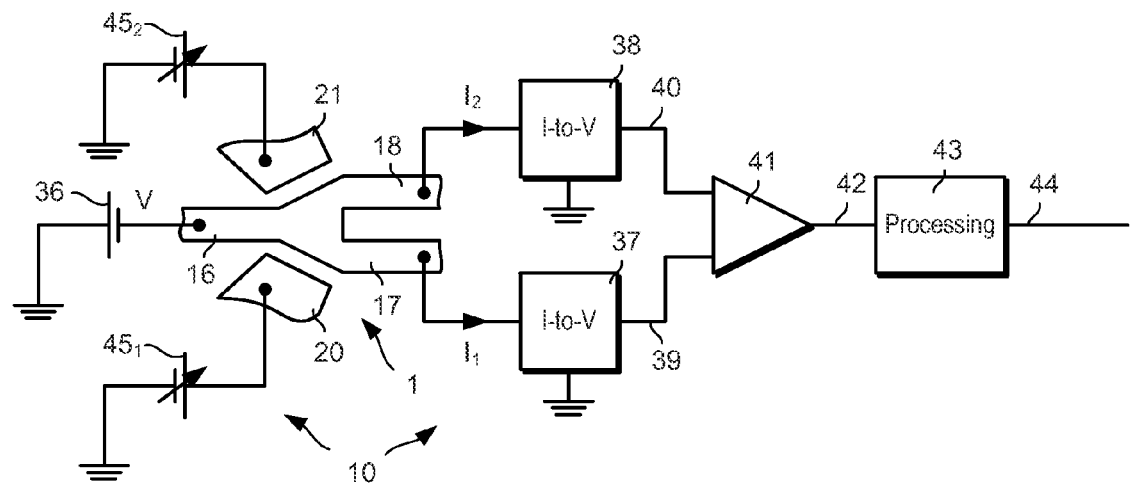
FIG. 5 illustrates a measurement circuit.
Figure 6:
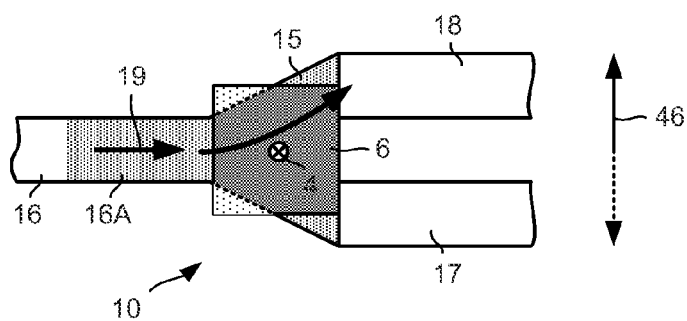
FIG. 6 illustrates deflection of charge in a sensor in a magnetic field.

Referring to FIGS. 5 and 6, operation of the sensor 1 will be described.

The measurement circuit 10 includes a first voltage source 36 which applies a bias, V, between the source 16 and each drain 17, 18. Thus, the currents flowing into the first and second drains 17, 18 are first and second currents, $I_1$, $I_2$, respectively.

Current-to-voltage converters 37, 38 may be used to generate first and second voltage signals 39, 40 dependent on the currents flowing into the drains 17, 18 and a difference between the voltage signals 39, 40 can be taken a differential amplifier 41 which produces an output voltage signal 42.

The output voltage signal 42 is fed into a processing circuit or block 43.

In a hard disk drive, the processing circuit 43 performs data detection and decoding, for example using partial response maximum likelihood (PRML) method, and error-correction. Further details can be found in Chapters 8 and 12 of "Magnetic Information Storage Technology" by Shan X. Wang and Alexander M. Taratorin, Academic Press (1999).

In magnetic imaging, the processing circuit 43 may perform similar processing. The sensor 1 may be one of many sensors, e.g. used in magnetic imaging. Thus, the processing circuit 43 may receive signals derived from many sensors and, for example, may build up an image.

In scanning magnetic imaging, the processing circuit 43 may receive signals from a positioning stage so as to obtain position information and, thus, build up an image accordingly.

Second and third voltage sources $45_1$, $45_2$ can be used to apply biases, $V_{G1}$, $V_{G2}$, to the gates 20, 21. As will be explained later, applying positive biases $V_{G1}$, $V_{G2}$ to the gates 20, 21 can be used to increase sensitivity of the sensor 1. Applying different biases $V_{G1}$, $V_{G2}$ to each gate 20, 21 can be used to compensate for asymmetries in the junction 15 and/or drains 17, 18.

Applying an external potential, V, between the source 16 and drains 17, 18 causes electrons 19 to move from the source 16 (herein also referred to as contact "C") the drains 17, 18 (herein also referred to as contacts "R" and "L").

The external magnetic field 4 originating from an external source 6, such as a magnetic bit whose flux impinges perpendicularly on the junction 15, causes at least partial deflection of the electrons 19 as they propagate from the source 16 to the drains 17, 18. As shown in FIG. 6, using an elongate section 16a helps to collimate the electrons 19.

The direction 46 of deflection towards the first drain ("R") 17 or the second drain ("L") 18 depends on the direction of magnetic field 4.

The sensor 1 can detect the magnitude of the magnetic field 4 which is perpendicular to the plane of junction 15 (or for a non-perpendicular field, the magnitude of its component which is perpendicular to the plane of junction 15) through changes in currents sensed at first and second drain contacts. The magnetoresistance (MR) of the sensor 1 is defined as the ratio of the current difference, $(I_R - I_L)$, divided by the total current $(I_R + I_L)$. Thus, the sensor 1 can detect the magnitude of the perpendicular component of magnetic field 4 by measuring the change in magnetoresistance of the device.

The magnetoresistance of the device is sensitive to the magnitude of the magnetic field in the sensing area 2, i.e. the junction 15. Variations in magnetic field elsewhere, for example in the source 16 and drains 17, 18 are not detected and do not alter the magnetoresistance.

As explained earlier, applying biases to the gates can be used to increase sensitivity. This is because applying positive bias increases the potential energy within the junction 15 and, thus, reduces the kinetic energy of the electrons 19 passing through the junction 15. Electrons 19 are effectively "slowed down" and so are influenced by the magnetic field 4 for longer, which in turn increases deflection.

The sensor 1 can be used to detect low magnetic fields at high temperatures, at room temperature (about 293° K) and above.

A scattering matrix method taking can be used to calculate transmission and reflection properties of the sensor 1.

The method is based on a model described by D. Csontos and H. Xu, Journal of Condensed Matter, volume 14, pages 12513 to 12328 (2002). However, the model is an extension of the earlier model in that it takes into account magnetic field.

The model involves solving the Schrödinger equation for quantized electrons in a quantum well in the presence of the magnetic field, calculating propagation transmission and reflection probabilities on the basis of the solution and calculating electrical transport through the device. The model ignores electron scattering by phonons since the estimated mean free path of electrons is assumed to be larger, e.g. much larger, than the dimensions of the device.

The magnetoresistance (MR) may be defined as:

$$MR(E)=(T_L-T_R)/(T_L+T_R+R_C), \quad (1)$$

where E is the energy of an incident electron propagating from the source 16 ("C") through the sensing region 2, i.e. junction 15, to the drains 17, 18 ("R" and "L"), $T_R$ is the transmission probability of an electron with energy E as it propagates to the first drain 17 ("R"), $T_L$ is the transmission probability of an electron propagating to the second drain 18 ("L") and $R_C$ is the probability that the electron will be reflected as it propagates to the junction 16 ("C").

FIGS. 7a to 7f each illustrate a model 47 of the sensor 1 under different conditions. The model 47 includes a first contact 48, junction 49, a first portion $50_1$ of a second contact 50, a second portion $50_2$ of the second contact 50, a first portion $51_1$ of a third contact 51 and a second portion $51_2$ of the third contact 51.

In FIG. 7a, under a set of conditions referred to as "condition 0", a magnetic field, B, of +50 mT and a gate bias, $V_G$ of 0.4 V is applied to the junction 49. No magnetic field and no gate bias are applied to the contacts 48, 50, 51.

In FIG. 7b, in "condition 1", a magnetic field, B, of +50 mT is applied to the junction 49 and the contacts 48, 50, 51 and a gate bias, $V_G$ of 0.4 V is applied to the junction 49 only.

In FIG. 7c, in "condition 2", a magnetic field, B, of +50 mT is applied to the junction 49 and the contacts 50, 51, a magnetic field, B, of −50 mT is applied to the contacts 49 and a gate bias, $V_G$ of 0.4 V is applied to the junction 49 only.

In FIG. 7d, in "condition 3", a magnetic field, B, of +50 mT is applied to the contacts 48m 50, 51, a magnetic field, B, of −50 mT is applied to the junction 49 and a gate bias, $V_G$, of 0.4 V is applied to the junction 49 only.

In FIG. 7e, in "condition 4", a magnetic field, B, of +50 mT is applied to the contact 48 and the second parts $50_2$, $51_2$ of the contacts 50, 51, a magnetic field, B, of −50 mT is applied to the first parts $50_1$, $51_1$ of the contacts 50, 51 and a gate bias, $V_G$ of 0.4 V is applied to the junction 49 only.

In FIG. 7f, in "condition 5", a magnetic field, B, of +50 mT is applied to the contact 48 and the junction 49 and a gate bias, $V_G$ of 0.4 V is applied to the junction 49 only.

Figure 8:
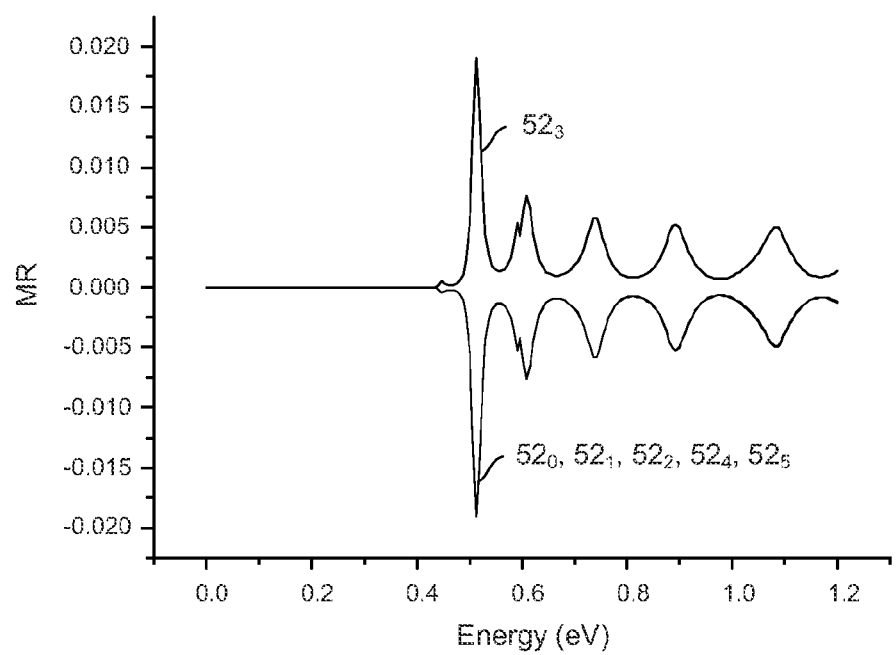
FIG. 8 illustrate plots of magnetoresistance for a model of the sensor under the conditions shown in FIGS. 7a to 7f.
Figure 9:
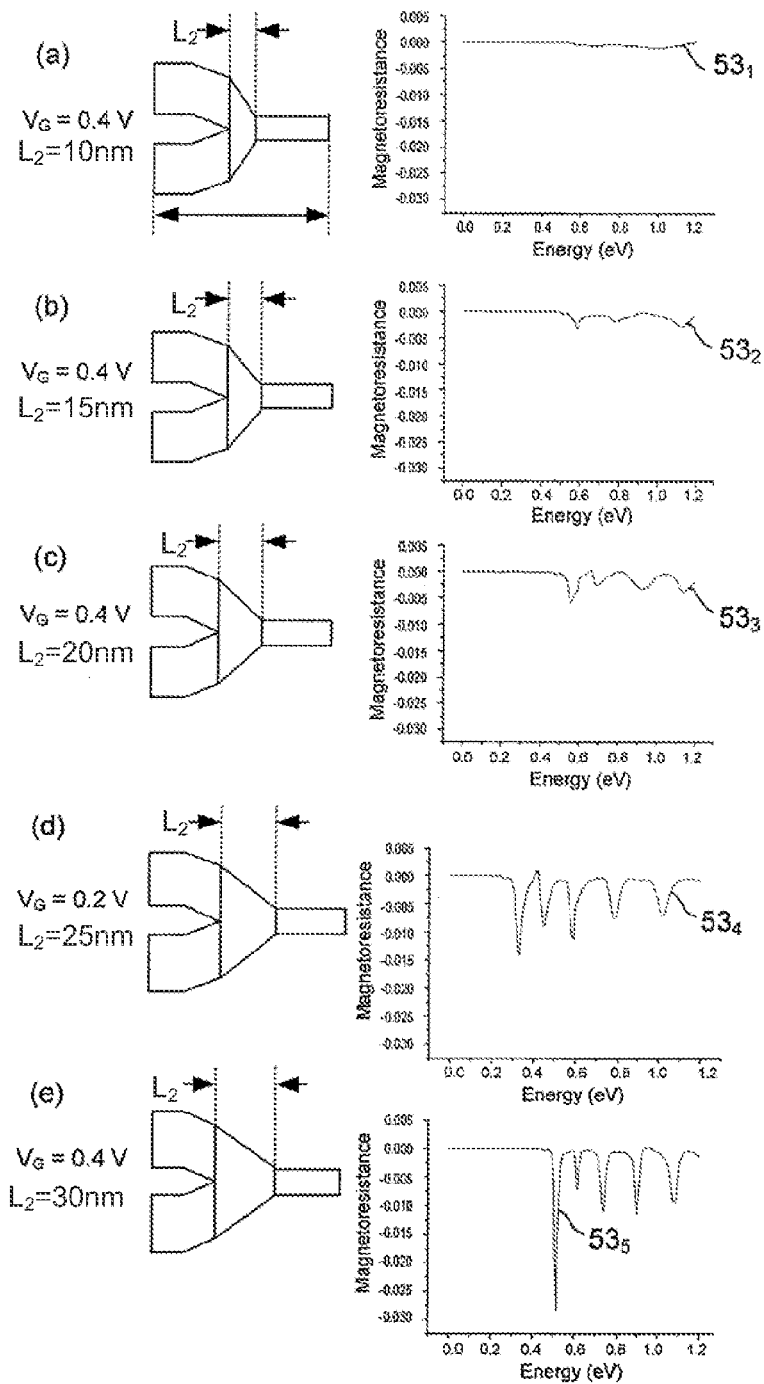
FIGS. 9a to 9e illustrate plots of magnetoresistance for models of a sensor having different geometries.

Referring also to FIG. 8, first to sixth plots $47_0$, $47_1$, $47_2$, $47_3$, $47_4$, $47_5$ of calculated MR(E) for the model 47 under conditions 0 to 5 respectively are shown.

FIG. 8 shows that a change of direction of magnetic field in the junction 49 changes the sign of energy-dependent magnetoresistance. Changes in direction of magnetic field in the contacts 48, 50, 51 do not change the sign of magnetoresistance.

FIGS. 9a to 9e illustrate how the magnetoresistance of the sensor 1 can be affected by change in device geometry.

In FIGS. 9a to 9e, the length, L2, of the junction 15 increases. Plots $53_1$, $53_2$, $53_3$, $53_4$, $53_5$, of magnetoresistance show an increase in magnitude of troughs in shown in FIG. 8a to 8f, the models 47 use a gate voltage of 0.4 V except in FIG. 8e, when the gate voltage is 0.2 V.

In FIGS. 9a to 9f, the length, $l_2$, of the junction 15 increases. Plots $53_1$, $53_2$, $53_3$, $53_4$, $53_5$ of magnetoresistance show an increase in magnitude of troughs in magnetoresistance as the length, $l_2$, of the model 47 of the sensor 1 increases. As shown in FIGS. 8a to 8f, the models 47 use a gate voltage of 0.4 V except in FIG. 8e, when the gate voltage is 0.2 V.

The geometry may depend on the choice of material and can vary depending on the shape of the magnetic field source, e.g. shape of bit cell, to be detected. The shape of the bit affects the shape of the sensor area and, thus, the rest of the device geometry.

FIGS. 10a to 10d illustrate how the magnetoresistance of the sensor 1 can respond to the application of a gate voltage.

Figure 10A:
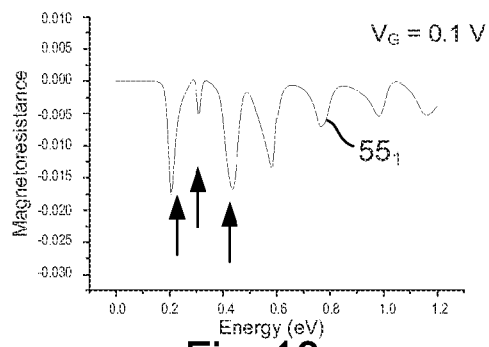
FIGS. 10a to 10c illustrate plots of magnetoresistance for models of a sensor under different gate biases.
Figure 10B:
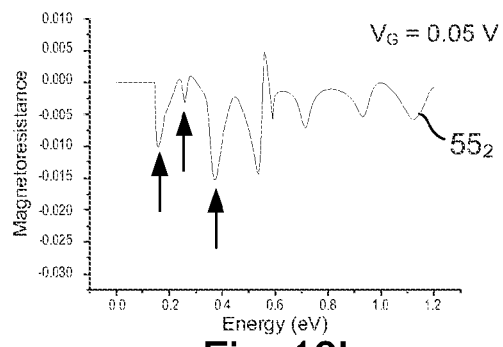
Figure 10C:
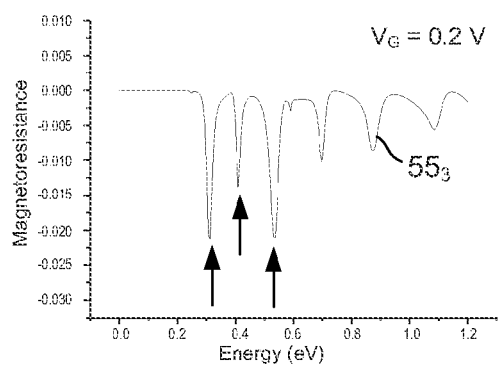
Figure 10D:
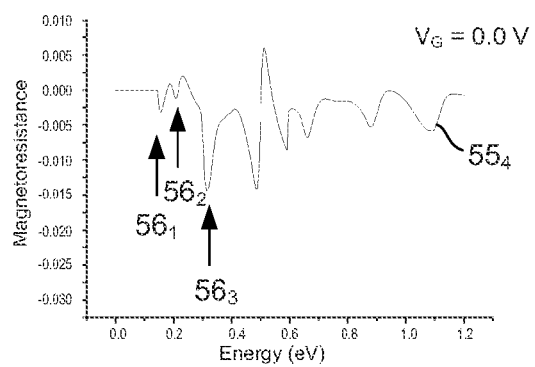

In FIG. 10a, a plot $55_1$ is shown of magnetoresistance for a gate bias of 0.1 V. In FIG. 10b, a plot $55_2$ is shown of magnetoresistance for a gate bias of 0.05 V. In FIG. 10c, a plot $55_3$ is shown of magnetoresistance for a gate bias of 0.2 V. In FIG. 10d, a plot $55_4$ is shown of magnetoresistance for no applied gate bias.

Plots $55_1$, $55_2$, $55_3$, $55_4$ of magnetoresistance show an increase in magnitude of troughs, e.g. $56_1$, $56_2$, $56_3$, in magnetoresistance as the gate bias is increased.

Thus, employing gates can improve device sensitivity and can be used to tune the device to increase its sensitivity. This feature can be help to increase yield when fabricating devices since variations in lithography can affect exact device geometry and can vary from device to device during manufacturing.

Figure 11A:
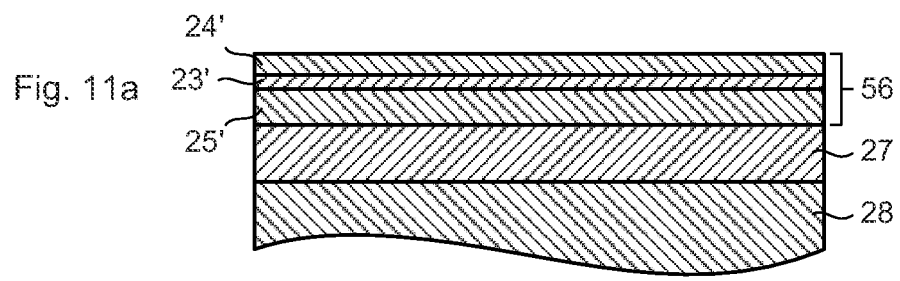
FIG. 11a to 11d illustrates steps during fabrication of the sensor shown in FIGS. 2 to 4.
Figure 11B:
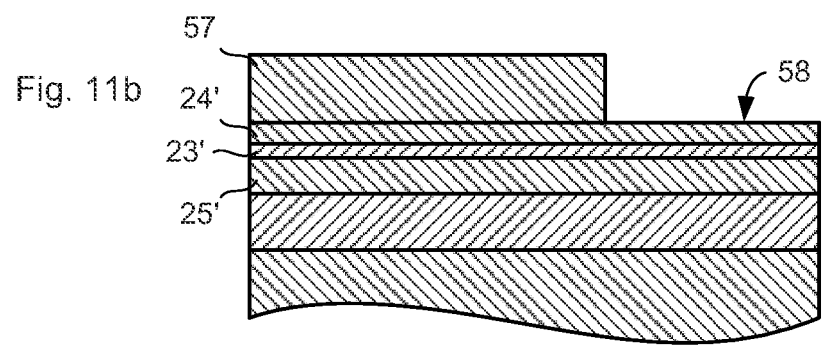
Figure 11C:
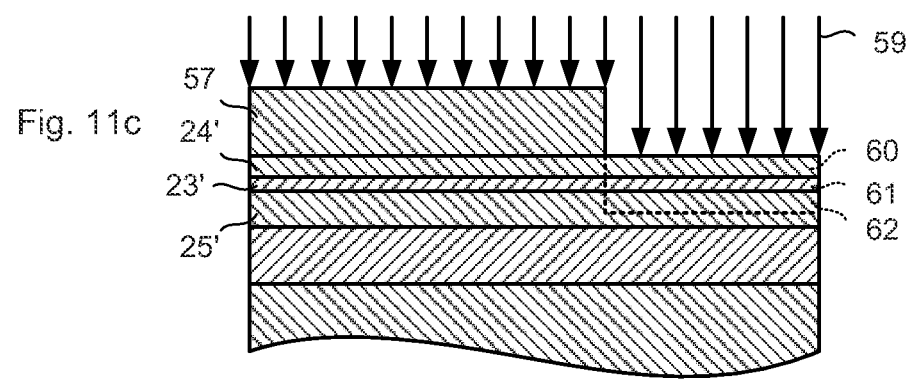

Referring to FIGS. 11a to 11c, a method of fabricating the sensor 1 will now be described.

Referring in particular to FIG. 11a, a layer structure 56 is grown on a substrate 26 for example, using molecular beam epitaxy (MBE). A buffer layer 27 may be included between the substrate 26 and the layer structure 56, e.g. to provide a detect-free surface for subsequent growth of the rest of the layer structure 56 or to provide lattice matching or introducing stress or strain into the rest of the layer structure 56.

The layer structure 56 is a single-crystal quantum well heterostructure. The layer structure 56 includes a first barrier layer 25', a well layer 23' and an upper barrier layer 24'. The upper barrier layer 24' may serve as a protective capping layer. Alternatively, an additional capping layer (not shown) may be provided. The layer structure 56 may be two-dimensional electron gas or hole heterostructure.

The well layer 23' may comprise III-V material, such as InAs or InSb, or a tertiary alloy based on, for example In, As, Sb. The well layer 23' may comprise silicon or germanium, alloys or compound semiconducting material. The barrier layers 24', 25' have a larger band gap and/or a band offset which results in formation of a barrier. The barrier layers 24', 25 may comprise III-V material, such as InAlAs. If the well layer 23' is formed from silicon or germanium (or a material based on these), then the barrier layers 24', 25' may comprise a compound of silicon or germanium, such as a nitride and/or oxide, such as $SiO_2$. The well layer 23' may be strained.

The mesa structures 22, 30, 31 (FIG. 2) are defined by nanolithography, such as electron beam or x-ray lithography and dry and/or wet etching, such as reactive ion etching or milling. A soft mask (i.e. a patterned layer of resist) or a hard mask (e.g. a thin metallic mask patterned by lithography and etching) may be used.

For example, referring to FIG. 11b, a soft mask 57 may be formed by spinning a layer of resist, such as hydrogen silsesquioxane (HSQ) or other positive resist, onto an upper surface 58 of the layer structure 56, exposing the resist layer (not shown) using a scanning electron beam and developing the exposed resist to remove exposed regions using a developer, such as MIBK/IPA.

Referring to FIG. 11c, reactive ion etch 59 portions 60, 61, 62 of the upper layer 25', well layer 23' and lower barrier layer 24' are removed by a reactive ion etch or ion milling.

Figure 11D:
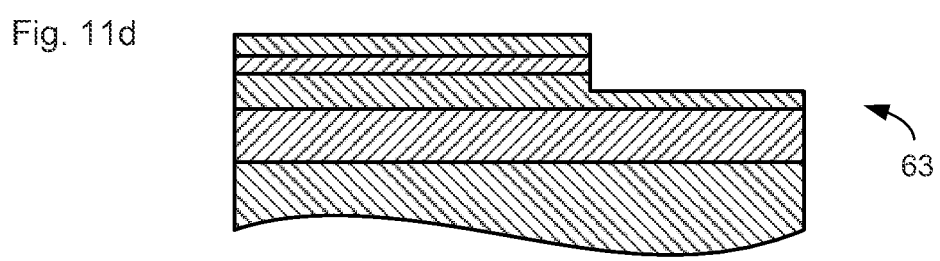

Referring to FIG. 11d, the resulting structure 63 is shown. Contacts to the source and drain regions and gates may be formed using electron-beam lithography or photolithography and depositing metallic layers, such as tantalum and gold (Ta:Au).

The mesa, i.e. etched structure 63, can be formed by ion milling using a hard mask formed of diamond-like carbon (DLC), as will now be described:

A full film of carbon (not shown) is deposited across the upper surface 58 of the wafer. A negative e-beam resist (not shown), e.g. PMMA, is applied over the diamond-like carbon film and patterned using e-beam lithography to form a resist mask (not shown).

A thin metallic film (not shown), such as chromium (Cr), is deposited through the resist etch mask and lifted off to form a metallic etch mask (not shown). Oxygen ($O_2$) or carbon dioxide ($CO_2$) reactive ion etching is used to transfer the pattern of the metallic etch mask into the DLC film to define a DLC hard mask (not shown).

Finally, the pattern of the DLC hard mask is transferred into the layer structure using ion milling. Ion milling also removes the original thin metallic mask used to form the hard mask.

This technique can be used to create fine features without any significant fences created by redeposition of etched material.

After milling, the remaining DLC hard mask can be removed with an $O_2$ or $CO_2$ RIE etch, similar to that used to define the original mask, and result in the structure 63 shown in FIG. 11d.

Figure 12:
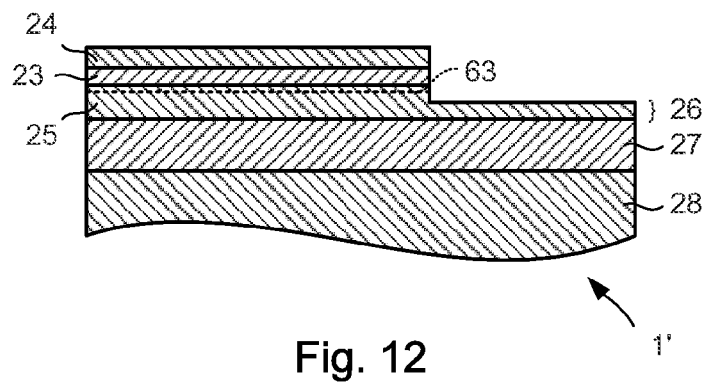
FIG. 12 illustrates an additional δ-doped layer in the sensor shown in FIG. 2.

Referring to FIG. 12, another embodiment of the sensor 1' is the same as the sensor 1 (FIG. 4) described earlier, but includes a delta-doped layer 63, for example comprising silicon having an areal density of about $1 \times 10^{20}$ cm$^{-2}$. The delta-doped layer 63 can be used to modify, e.g. increase, carrier density in the conductive layer 23. The delta-doped layer 63 is placed outside, e.g. below, the conductive layer 23 so as not to introduce impurities in the conductive layer 23.

Figure 13:
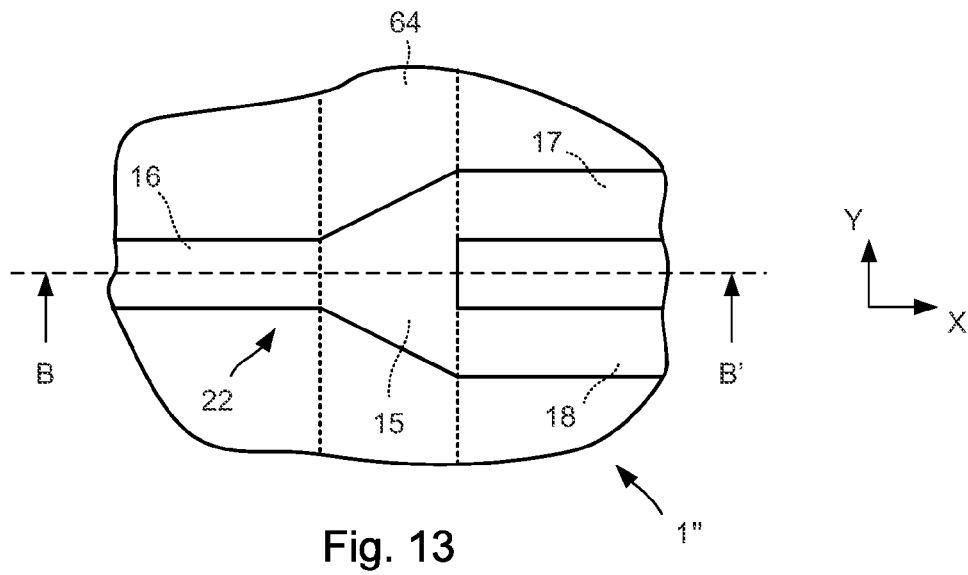
FIG. 13 is a plan view of another sensor having a bottom gate.
Figure 14:
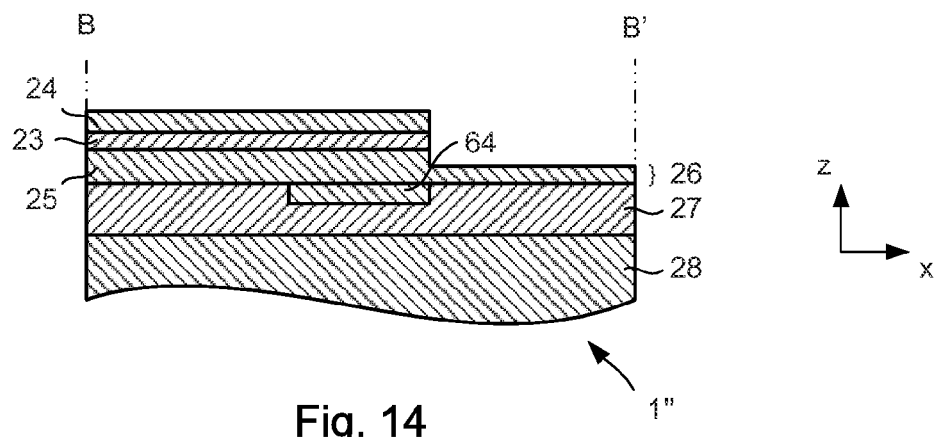
FIG. 14 is a cross sectional view of the sensor shown in FIG. 13 taken along the line B-B'.

Referring to FIGS. 13 and 14, yet another embodiment of the sensor 1" is the same as the sensor 1 (FIG. 4) described earlier, but excludes side mesa structures 30, 31 and, instead, includes a bottom gate 64. The bottom gate 64 may be formed by ion implantation.

It will be appreciated that many modifications may be made to the embodiments hereinbefore described.

For example, the sensor may be used in applications other than data storage and imaging which require sensing and measurement of magnetic fields.

Materials other than, for example InSb, can be used. For example, other materials having a high mobility (e.g. of the order of $10^3$ or $10^4$ cm$^2$V$^{-1}$s$^{-1}$ at 300° K) can be used. The material making up the junction and leads need not be single crystal.

The geometry and dimensions of the 'Y' junction can be modified, e.g. by routine experiment, so as to find other suitable device geometry. For example, the geometry and/or dimension of a device can be modified and the modified device tested to ascertain whether the magnetoresistance is larger or smaller.

The charge carriers may form a substantially collinear beam or substantially parallel beam.

The sensor may operate based on electron or hole transport. Transport may include both ballistic and diffusive transport components.

While various embodiments have been described above, it should be understood that they have been presented by way of example only, and not limitation. Other embodiments falling within the scope of the present invention may also become apparent to those skilled in the art. Thus, the breadth and scope of the invention may also become apparent to those skilled in the art. Thus, the breadth and scope of the invention should not be limited by any of the above-described exemplary embodiments, but should be defined only in accordance with the following claims and their equivalents.

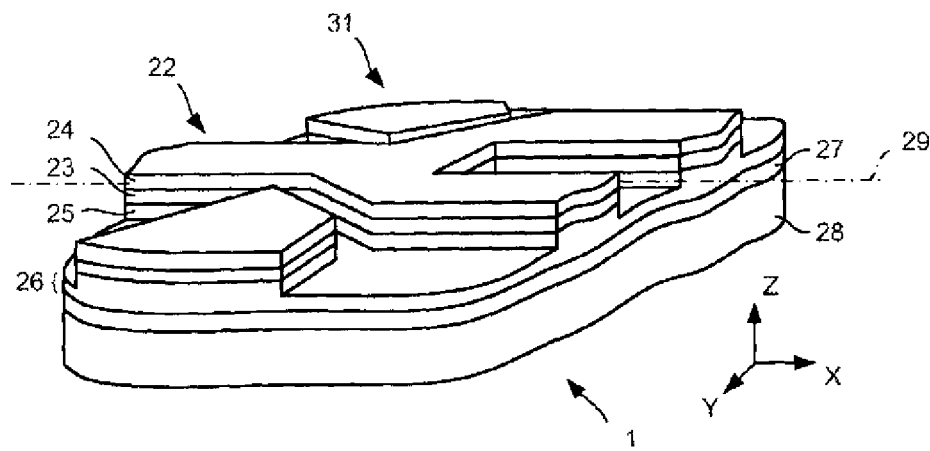

What is claimed is:

1. A device for sensing a magnetic field comprising:
   first, second and third leads; and
   a junction connected with the first, second and third leads;
   wherein
   the junction and the leads are arranged in a plane and the junction is configured to exhibit quantum confinement in a direction perpendicular to the plane, wherein the first lead is arranged on one side of the junction and the second and third leads are arranged on an opposite side of the junction.

2. The device as in claim 1, wherein the first lead is elongated along a longitudinal axis and, when charge carriers flow from the first lead into the junction, the charge carriers flow substantially parallel to the longitudinal axis.

3. The device as in claim 1, wherein the first lead is configured to exhibit quantum confinement in a lateral direction so as to provide a quantum wire.

4. The device as in claim 1, further comprising a gate structure configured to provide an electrostatic lens for focussing charge carriers in the first lead so as to limit the angle of spread of charge carriers entering the junction.

5. The device as in claim 1, wherein a portion of the first lead which is configured to limit angle of spread of charge carriers entering the junction is adjacent to the junction.

6. The device as in claim 1, wherein the junction comprises non-ferromagnetic and/or semiconducting material.

7. The device as in claim 1, wherein the junction has an area equal to or less than about 1000 nm$^2$.

* * * * *

UNITED STATES PATENT AND TRADEMARK OFFICE
CERTIFICATE OF CORRECTION

Page 1 of 3

PATENT NO. : 8,587,897 B2
APPLICATION NO. : 12/565555
DATED : November 19, 2013
INVENTOR(S) : Andreev et al.

It is certified that error appears in the above-identified patent and that said Letters Patent is hereby corrected as shown below:

Delete Title Page, and substitute therefor, new Title Page. (attached)

Please include the following non-printed, allowed claims after the existing claims in col. 12, line 56, In the claims:

8. The device as in claim 1, wherein the first lead and the junction are arranged in a line, wherein the junction is forward of the first lead, and the second and third leads are configured to branch forwardly from the junction on each side of the line.

9. The device as in claim 1, wherein the junction increases in width from the first lead to the second and third leads.

10. The device as in claim 1, wherein the device comprises:
at least four leads connected to the junction, the at least four leads including the first lead and the second and third leads.

11. The device as in claim 1, wherein the device further comprises:
a gate structure for applying an electric field to the junction.

12. The device as in claim 11, wherein the gate structure includes gates arranged either side of the junction.

13. The device as in claim 1, wherein the junction comprises a region of material having a relatively small bandgap sandwiched between underlying and overlying regions of material(s) having relatively large bandgap(s).

14. The device as in claim 1, wherein the junction comprises an electron or hole gas.

Signed and Sealed this
Fifteenth Day of July, 2014

Michelle K. Lee
*Deputy Director of the United States Patent and Trademark Office*

15. The device as in claim 1, wherein the junction comprises an alloy of group III and group V elements or comprises a group IV element.

16. The device as in claim 1, wherein the junction is under strain or stress.

17. The device as in claim 1, further comprising a circuit configured to cause current to flow from the first lead into the second and third leads and to compare magnitudes of current flowing into the second and third leads respectively.

CERTIFICATE OF CORRECTION (continued)

(12) United States Patent
Andreev et al.

(10) Patent No.: US 8,587,897 B2
(45) Date of Patent: Nov. 19, 2013

(54) MAGNETIC FIELD SENSOR

(75) Inventors: Aleksey Andreev, Cambridge (GB); David Williams, Cambridge (GB); Ernesto E. Marinero, Saratoga, CA (US); Bruce A. Gurney, San Jose, CA (US); Thomas D. Boone, Jr., San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 636 days.

(21) Appl. No.: 12/565,555

(22) Filed: Sep. 23, 2009

(65) Prior Publication Data
US 2010/0073796 A1 Mar. 25, 2010

(30) Foreign Application Priority Data

Sep. 23, 2008 (EP) .................... 08164950

(51) Int. Cl.
*G11B 5/37* (2006.01)

(52) U.S. Cl.
USPC ........................................ 360/112

(58) Field of Classification Search
USPC ........ 360/112, 313; 850/46, 48; 235/449, 493
See application file for complete search history.

(56) References Cited

U.S. PATENT DOCUMENTS

| 5,208,477 A * | 5/1993 | Kub ................... 257/421 |
| 7,440,227 B2 * | 10/2008 | Chattopadhyay et al. .... 360/112 |
| 2002/0117656 A1 | 8/2002 | Amin et al. ............ 257/9 |

FOREIGN PATENT DOCUMENTS

| AU | 2008/201551 | 5/2008 |
| WO | 97/47982 | 12/1997 |
| WO | 02/19436 | 3/2002 |
| WO | 2008/033303 | 3/2008 |

OTHER PUBLICATIONS

Chapter 12 of "Magnetic Information Storage Technology" ibid.
Brataas A. et al: "Non-collinear magnetoelectronics" Physics Reports, North-Holland, vol. 427, No. 4, Apr. 1, 2006, p. 157-255.
Goodnick et al:"Quantum-effect and single-electron devices" IEEE Transactions on Nanotechnology, IEEE Service Center, Piscataway, NJ, US, vol. 2, No. 4, Dec. 1, 2003, p. 368-385.
Martn J I et al:"Ordered magnetic nanostructures: fabrication and properties" Journal of Magnetism and Magnetic Materials, Elsevier Science Publishers, Amsterdam, NL, vol 256, No. 1-3, Jan. 1, 2003, p. 449-501.
Merkt U: "Hybrid semiconductor/metal nanostructures with two-dimensional electron systems" Superlattices and Microstructures, Academic Press, London, GB, vol. 33, No. 5-6, May 1, 2003, p. 357-367.

(Continued)

*Primary Examiner* — Julie Anne Watko
(74) *Attorney, Agent, or Firm* — Zilka-Kotab, PC

(57) ABSTRACT

A device for sensing a magnetic field is described. The device comprises first, second and third leads and a junction between the leads. The junction and leads are arranged in a plane and the junction is configured to exhibit quantum confinement in a direction perpendicular to the plane. The first lead is arranged on one side of the junction and the second and third leads are arranged on an opposite side of the junction. The first lead is configured to limit angle of spread of charge carriers entering the junction so that, when charge carriers flow into the junction from the first lead, the charge carriers form a substantially nondivergent beam.

17 Claims, 9 Drawing Sheets